April 18, 1961 C. D. RAUSCH 2,980,864
VOLTAGE CONTROLLED OSCILLATOR
Filed Aug. 14, 1959
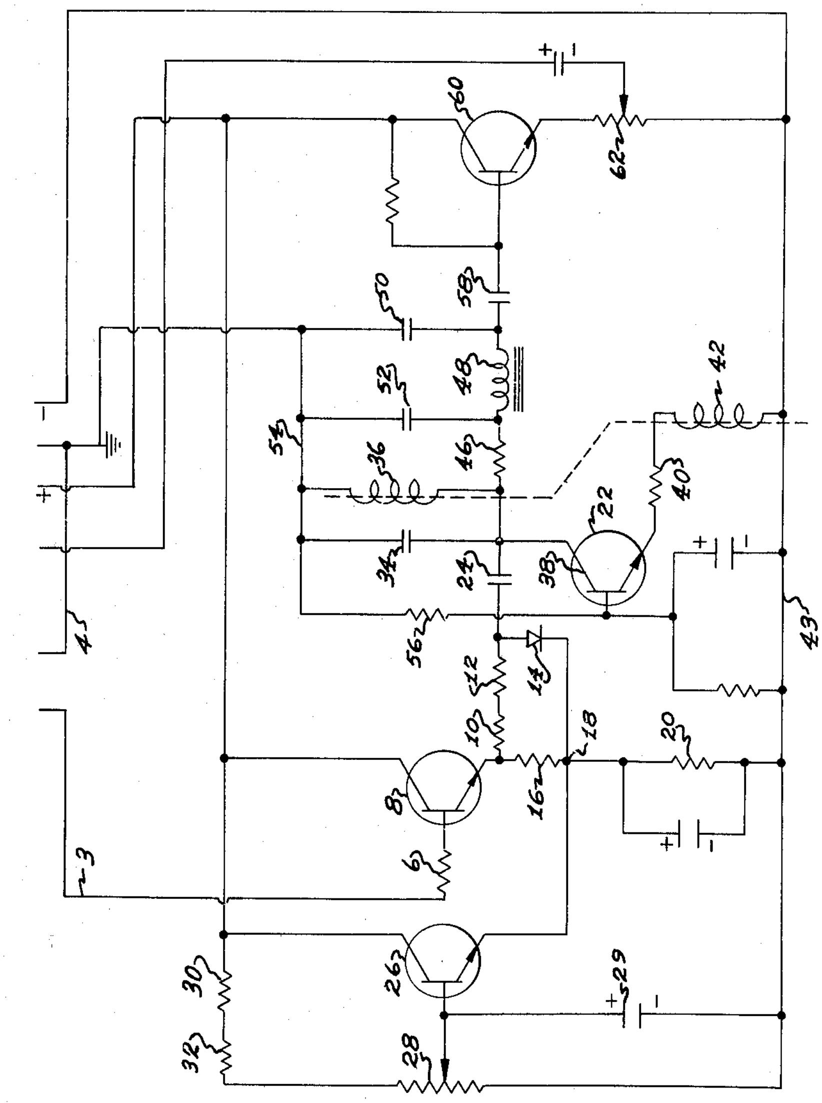
INVENTOR.
CURTIS D. RAUSCH
BY
Wm. H. Dean
AGENT 2,980,864
Patented Apr. 18, 1961

2,980,864

VOLTAGE CONTROLLED OSCILLATOR

Curtis Dean Rausch, Scottsdale, Ariz., assignor to Savage Industries, Inc., a corporation of Arizona Filed Aug. 14, 1959, Ser. No. 833,738
1 Claim. (Cl. 331—109)

This invention relates to a voltage controlled oscillator and more particularly to a voltage controlled oscillator which responds to variations in signal voltage to produce variations in frequency being linear with respect to said variations in signal voltage.

It has been recognized that a need exists for a small telemetering transmitter which has very low power consumption, which is physically small, and which may be applied to various devices and equipment to transmit information therefrom to a remote location.

Great difficulty has been experienced in measuring temperature and/or stress relative to the structures of turbine wheels which rotate at high speeds and preclude the use of slip ring conductors. Other needs for such a small, compact transmitter exist in the operation of vehicles and missiles from which a variety of signals must be transmitted.

Since thermocouples develop a small voltage which varies with temperature, and since it is convenient to measure other varying functions by means of voltage variations the use of a voltage controlled oscillator is desirable. Further, such an oscillator is preferably an FM type so that noise may be held to a minimum.

As oscillator for use on high speed devices must be very small so that it can be encapsulated to withstand high accelerative forces and must contain means to compensate it for substantial variations in environmental temperatures.

Accordingly, it is an object of the present invention to provide a voltage controlled oscillator which is physically small and which lends itself to encapsulation in various resinous materials, thereby permitting the oscillator to operate under high accelerative forces.

Another object of the invention is to provide a voltage controlled oscillator which modulates its output frequency linearly with respect to voltage signals received thereby.

Another object of the invention is to provide a voltage controlled oscillator which is stable in operation when subjected to substantial variations of environmental temperature.

Another object of the invention is to provide a voltage controlled oscillator wherein a diode is coupled, in a forward conducting mode, to a tuned circuit; the impedance of the diode varying approximately as the square of the current through it, thereby compensating for the square root relationship of the capacitance to the frequency of the tuned circuit whereby, the frequency is varied linearly with respect to variations of the signal voltage.

Other objects and advantages of the invention may be apparent from the following specification, appended claim and accompanying drawings in which:

The figure of the drawing is a schematic diagram of the voltage controlled oscillator of the present invention.

As shown in the drawing a D.C. voltage signal appears between conductors 3 and 4; the conductor 4 being ground to the signal while the conductor 3 is the hot side of the circuit. The conductor 3 is coupled through a resistor 6 to the base of a transistor 8. This transistor 8 is an emitter follower transistor employed to provide a very high input impedance for the signal. The transistor 8 serves as a current source in response to the input signal and coupled to the emitter of this transistor 8 is a resistor 10 in series with a sensitor 12. The signal is conducted from the emitter through the resistor 10, sensitor 12 and is applied to a diode 14.

The resistor 10 and sensitor 12 combine to provide for temperature stabilization of the diode 14.

A load resistor 16 is coupled to the emitter of the transistor 8 and the opposite end of the load resistor is coupled to the circuit to a point 18. An end of the diode 14, opposite to the sensitor 12, is coupled to the circuit at 18 at which point a resistor 20 is also connected to control a D.C. bias for the transistor 8.

The signal is applied to the diode 14 through the emitter follower providing a low impedance output and a high impedance input. The signal causes forward conduction of the diode 14 and the conduction is varied as voltage changes are applied by the signal.

A transistor 26 is used to set the voltage on the resistor 20 to control the D.C. bias on the transistor 8.

A trimpot or potentiometer 28, connected to the base of the transistor 26, is variable to provide a center frequency adjustment which is coupled at 18 to locate the center frequency of the voltage controlled oscillator. Connected across this potentiometer is a capacitor 29.

The voltage on the transistor 26 does not appear as a signal. This part of the circuit is preset and is not varied by the input signal.

Disposed in this circuit is another sensitor 30 in series with a resistor 32, the potentiometer 28 and the collectors or the transistors 8 and 26. This provides a proper bias for the transistor 26 and also aids in compensation for variations in environmental temperature. This sensitor 12 previously discussed is also used to adjust the gain, that is the voltage input relative to the deviation of frequency output. Thus, an adjustment may be made to attain a constant gain versus changes in temperature. However, the sensitor 30 is employed additionally to attain center frequency stability.

The capacitor 24 interconnects the diode 14 and a tank circuit comprising another capacitor 34 and an inductance coil 36. The transistor 22 is a feed-back oscillator having its collector 38 coupled to the tank circuit. This transistor is also connected, through its emitter and a resistor 40, to a coil 42 which is inductively coupled to the coil 36 of the tank circuit. The base of the transistor 22 is at A.C. ground 43 to provide for proper operation. The resistor 40 allows a desirable wave form and stable operation. It applies a considerable amount of feedback to the transistor 22 and permits a considerable percentage of transistors to work satisfactorily in the circuit without selection of such transistors.

The output of the transistor 22 is applied through a resistor 46 to a constant K type filter. The resistor 46 is used to isolate the reactance of the filter from the tank.

The filter comprises a choke coil 48 and a pair of capacitors 50 and 52 which are coupled to the tank circuit by a conductor 54 which is also coupled through a resistor 56 to the base of the transistor 22.

The output of the filter is coupled through a capacitor 58 to the base of an emitter follower transistor 60. The output of the emitter follower is applied to a potentiometer 62 which provides for output amplitude control.

It will be obvious to those skilled in the art that various modifications of the invention may be resorted to in a manner limited only by a just interpretation of the following claim.

I claim:

In a means for varying frequency linearly with respect to variations in a signal voltage the combination of: a tuned circuit comprising capacitance and inductance means, a diode coupled to said circuit and disposed to operate in a forward conducting mode whereby, the frequency is varied linearly with respect to variations of the signal voltage; a current feed for said diode comprising a transistor; means disposed to conduct a varying voltage signal to the base thereof; a temperature sensitive resistor means coupled between the emitter of said transistor and said diode, said resistor responsive to compensate for thermally induced changes in the operation of said diode; a load resistor coupled to the emitter of said transistor, a bias voltage source coupled to said load resistor and to an end of said diode which is opposite said temperature sensitive resistor; a center of frequency adjusting circuit comprising; a second transistor; an emitter of said second transistor connected between said bias voltage source and said load resistor; a potentiometer coupled to the base of said second transistor to provide a center of frequency adjustment which appears as an adjustment induced in the circuit between said load resistor and the bias for said first transistor; and temperature sensitive resistor means coupled in series with said potentiometer and the collectors of both said first and second transistors.

References Cited in the file of this patent

UNITED STATES PATENTS

| | | |
|---|---|---|
| 2,583,138 | Carter et al. | Jan. 22, 1952 |
| 2,748,284 | Segerstrom | May 29, 1956 |
| 2,768,293 | Hofweegen | Oct. 23, 1956 |
| 2,771,584 | Thomas | Nov. 20, 1956 |